US010211285B2

(12) United States Patent
Nagao

(10) Patent No.: US 10,211,285 B2
(45) Date of Patent: Feb. 19, 2019

(54) SEMICONDUCTOR DEVICE, AND METHOD FOR MANUFACTURING SEMICONDUCTOR DEVICE

(71) Applicant: ROHM CO., LTD., Kyoto-shi, Kyoto (JP)

(72) Inventor: Katsuhisa Nagao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 19 days.

(21) Appl. No.: 15/419,565

(22) Filed: Jan. 30, 2017

(65) Prior Publication Data

US 2017/0179223 A1 Jun. 22, 2017

Related U.S. Application Data

(63) Continuation of application No. 14/384,598, filed as application No. PCT/JP2013/056601 on Mar. 11, 2013, now Pat. No. 9,595,584.

(30) Foreign Application Priority Data

Mar. 12, 2012 (JP) ................................ 2012-054953

(51) Int. Cl.
*H01L 21/78* (2006.01)
*H01L 29/16* (2006.01)
(Continued)

(52) U.S. Cl.
CPC ........ *H01L 29/0623* (2013.01); *G01R 31/129* (2013.01); *H01L 21/761* (2013.01);
(Continued)

(58) Field of Classification Search
CPC .......................... H01L 29/872; H01L 29/0623
(Continued)

(56) References Cited

U.S. PATENT DOCUMENTS 5,994,754 A 11/1999 Hayashi et al.
7,825,017 B2 11/2010 Yamamoto et al.
(Continued)

FOREIGN PATENT DOCUMENTS

JP 54045570 4/1979
JP 60050937 3/1985
(Continued)

OTHER PUBLICATIONS

International Preliminary Report on Patentability and Written Opinion for PCT/JP2013/056601, dated Sep. 25, 2014, 16 pages.
(Continued)

*Primary Examiner* — Moazzam Hossain
*Assistant Examiner* — Hajar Kolahdouzan
(74) *Attorney, Agent, or Firm* — Hamre, Schumann, Mueller & Larson, P.C.

(57) ABSTRACT

[Object] To provide a semiconductor device capable of improving a discharge starting voltage when measuring electric characteristics, and widening a pad area of a surface electrode or increasing the number of semiconductor devices (number of chips) to be obtained from one wafer, and a method for manufacturing the same.

[Solution Means] A semiconductor device 1 includes an n-type SiC layer 2 having a first surface 2A, a second surface 2B, and end faces 2C, a p-type voltage relaxing layer 7 formed in the SiC layer 2 so as to be exposed to the end portion of the first surface 2A of the SiC layer 2, an insulating layer 8 formed on the SiC layer 2 so as to cover the voltage relaxing layer 7, and an anode electrode 9 that is connected to the first surface 2A of the SiC layer 2 through the insulating layer 8 and has a pad area 95 selectively exposed.

21 Claims, 11 Drawing Sheets

(51) Int. Cl.

| | |
|---|---|
| ***G01R 31/12*** | (2006.01) |
| ***H01L 29/06*** | (2006.01) |
| ***H01L 29/872*** | (2006.01) |
| ***H01L 29/78*** | (2006.01) |
| ***H01L 21/66*** | (2006.01) |
| ***H01L 21/761*** | (2006.01) |
| ***H01L 29/40*** | (2006.01) |
| ***H01L 29/47*** | (2006.01) |
| *G01R 31/26* | (2014.01) |

(52) U.S. Cl.
CPC .............. *H01L 21/78* (2013.01); *H01L 22/14* (2013.01); *H01L 29/0619* (2013.01); *H01L 29/0692* (2013.01); *H01L 29/0696* (2013.01); *H01L 29/1608* (2013.01); *H01L 29/408* (2013.01); *H01L 29/47* (2013.01); *H01L 29/78* (2013.01); *H01L 29/7811* (2013.01); *H01L 29/872* (2013.01); *G01R 31/2648* (2013.01); *H01L 2224/0603* (2013.01)

(58) Field of Classification Search
USPC ........................................................... 257/77
See application file for complete search history.

(56) References Cited

U.S. PATENT DOCUMENTS

| | | | |
|---|---|---|---|
| 2005/0158979 | A1 | 7/2005 | Momota et al. |
| 2007/0221953 | A1 | 9/2007 | Sakamoto |
| 2009/0236611 | A1 | 9/2009 | Yamamoto et al. |
| 2009/0267082 | A1 | 10/2009 | Yamamoto et al. |
| 2010/0314629 | A1* | 12/2010 | Tarui .................. H01L 29/0615 257/77 |

FOREIGN PATENT DOCUMENTS

| | | |
|---|---|---|
| JP | 8306937 | 11/1996 |
| JP | 10200090 | 7/1998 |
| JP | 2001176876 | 6/2001 |
| JP | 2003100819 | 4/2003 |
| JP | 2003197921 | 7/2003 |
| JP | 2003298071 | 10/2003 |
| JP | 2004363518 | 12/2004 |
| JP | 2006344802 | 12/2006 |
| JP | 2007288172 | 11/2007 |
| JP | 2009231321 | 10/2009 |
| JP | 2009267032 | 11/2009 |
| JP | 4535151 | 9/2010 |
| JP | 2011243837 | 12/2011 |
| WO | 2009101668 | 8/2009 |

OTHER PUBLICATIONS

Shibuya. "Breakdown Time Lag of Short Gaps in Various Gases", The Transactions of the Institute of Electrical Engineers of Japan, A vol. 94, No. 5, pp. 181-188 (1974), and partial English translation.
Toriyama et al. "High Voltage Engineering", Corona Publishing Co., Ltd., pp. 64-66 (Apr. 30, 1957), and partial English translation.
Baliga. "Fundamentals of Power Semiconductor Devices", Springer, pp. 1-18 (2008).

* cited by examiner

S1
Form voltage relaxing layer
S2
Form first layer
S3
Form anode electrodes
S4
Form second layer
S5
Open second layer
S6
Measure electric characteristics
(maximum applied voltage Y≧1000V)
S7
Dicing
(dividing into individual pieces)

4
7
85
221
(22)
71
25
26
3(109)
82
8
81
83

4
7
85
221
(22)
71
25
27
3(109)
82
8
81
83

4
7
85
221
(22)
71
25
28
3(109)
82
8
81
83

SEMICONDUCTOR DEVICE, AND METHOD FOR MANUFACTURING SEMICONDUCTOR DEVICE

TECHNICAL FIELD

The present invention relates to a semiconductor device using SiC and a method for manufacturing the same.

BACKGROUND ART

Conventionally, a problem of discharge in the atmosphere occurs when measuring electric characteristics of a high withstand voltage semiconductor device.

As a measure against this, for example, Patent Document 1 discloses a method for manufacturing a semiconductor device, including steps of forming base regions and emitter regions on a semiconductor wafer, patterning a base electrode and an emitter electrode, and then fitting and patterning a polyimide film onto the surface to cover regions except for a dicing region and other electrode bonding portions.

CITATION LIST

Patent Documents

Patent Document 1: Japanese Patent Application Publication No. 60-50937

Patent Document 2: Japanese Patent Application Publication No. 54-45570

Patent Document 3: Japanese Patent Application Publication No. 2011-243837

Patent Document 4: Japanese Patent Application Publication No. 2001-176876

Patent Document 5: Japanese re-publication of PCT international application No. WO2009/101668

SUMMARY OF THE INVENTION

Problems to be Solved by the Invention

An object of the present invention is to provide a semiconductor device capable of improving a discharge starting voltage when measuring electric characteristics, and widening a pad area of a surface electrode to be larger than conventionally, and a method for manufacturing the same.

Another object of the present invention is to provide a semiconductor device capable of improving a discharge starting voltage when measuring electric characteristics, and increasing the number of semiconductor devices (number of chips) to be obtained from one wafer to be larger than conventionally, and a method for manufacturing the same.

Means for Solving the Problems

A semiconductor device according to the present invention includes a first conductive-type SiC layer having a first surface, a second surface and end faces surrounding the first surface and the second surface, the SiC layer having a semiconductor device structure, a second conductive-type voltage relaxing layer formed in the SiC layer such that the voltage relaxing layer is exposed to an end portion of the first surface of the SiC layer, an insulating layer covering the voltage relaxing layer, and a surface electrode connected to the first surface of the SiC layer through the insulating layer, the surface electrode having a pad area selectively exposed (Aspect 1).

This semiconductor device can be manufactured by a method for manufacturing a semiconductor device, including the steps of, in a first conductive-type SiC wafer which has a first surface and a second surface and a dicing region with a predetermined width set to segment a plurality of device regions, forming a semiconductor device structure in each of the device regions, forming a second conductive-type voltage relaxing layer with a width wider than that of the dicing region along the dicing region so as to be across the device regions adjacent to each other, forming an insulating layer on the SiC wafer so as to cover the voltage relaxing layer, forming a surface electrode in each of the device regions so that the surface electrode is connected to the first surface of the SiC wafer through the insulating layer and partially selectively exposed as a pad area, measuring electric characteristics of the semiconductor device structure of the device regions by applying a maximum applied voltage (BV) that generates a potential difference of 1000 V or more between the surface electrode and the SiC wafer in one of the device regions, and dividing the SiC wafer into individual pieces of the plurality of semiconductor devices by cutting the SiC wafer along the dicing region (Aspect 20).

When measuring electric characteristics of the semiconductor device structure, in order to prevent discharge between the dicing region and the surface electrode, the discharge starting voltage V between the dicing region and the surface electrode must be set to a value higher than the maximum applied voltage (BV) (≥1000 V). The maximum applied voltage (BV) is a voltage (breakdown voltage: BV) when the semiconductor device structure causes avalanche breakdown, and between the dicing region and the surface electrode, a potential difference corresponding to this maximum applied voltage (BV) occurs. On the other hand, the discharge starting voltage V is a voltage when an insulator such as the atmosphere present between the dicing region and the surface electrode is broken down and an electric current starts to flow between the dicing region and the surface electrode. Specifically, as long as the relationship of the discharge starting voltage V>the maximum applied voltage (BV) is satisfied, an insulated condition between the dicing region and the surface electrode is maintained.

Therefore, according to the present invention, a voltage relaxing layer is formed along the dicing region, and further, the voltage relaxing layer is covered by an insulating layer. Therefore, when measuring electric characteristics of the semiconductor device structure, the maximum applied voltage (BV) can be relaxed in two stages of the insulating layer and the voltage relaxing layer. Accordingly, the burden of the voltage on the atmosphere between the dicing region and the surface electrode can be eased. In other words, the voltage applied between the dicing region and the surface electrode can be divided by the atmosphere, the insulating layer, and the voltage relaxing layer, so that even if the discharge starting voltage V in the atmosphere is set to be lower than conventionally, the relationship of the discharge starting voltage V>the maximum applied voltage (BV) can be maintained.

Here, based on Paschen's Law, the discharge starting voltage V between two electrodes is expressed by a function of the product of a gas pressure P and the interval between the electrodes (in the present invention, the distance X1 from the end of the pad area to the dicing region) (V=f (P·X1)). According to the present invention, the discharge starting voltage V in the atmosphere can be set to be lower than conventionally, so that based on Paschen's Law, the distance X1 from the end of the pad area to the dicing region (end face of the SiC layer) can be made shorter than conventionally.

Therefore, when the size of the semiconductor device (chip size) is set to be equal to the conventional one, the outer edge of the pad area can be extended to the end face side of the SiC layer, so that the pad area of the surface electrode can be made wider than conventionally. On the other hand, when the size of the pad area of the surface electrode is set to be equal to the conventional one, the end faces of the SiC layer can be shortened to the pad area side, so that the number of semiconductor devices (number of chips) to be obtained from one SiC wafer can be increased to be larger than conventionally.

Furthermore, even if a defect (such as a hole, etc., caused by a process failure) occurs in one of the insulating layer and the voltage relaxing layer, the defect can be covered by the other. Therefore, discharge between the dicing region and the surface electrode can be effectively prevented from occurring.

In the semiconductor device according to the present invention, it is preferable that the maximum applied voltage (BV) Y (≥1000 V) of the semiconductor device structure and the distance X1 from the end of the pad area to the end face of the SiC layer satisfy the following relational expression (1) (Aspect 2). Regarding the manufacturing method, the step of forming the surface electrode preferably includes a step of setting the size of the pad area so that the maximum applied voltage (BV) Y (≥1000 V) of the semiconductor device structure and the distance X1 from the end of the pad area to the dicing region satisfy the following relational expression (1) (Aspect 21).

[Numerical expression 1] (1)

$$\left(855\cdot\ln\frac{Y}{1053}\right)\leqq X1\leqq\left(855\cdot\ln\frac{Y}{1053}\right)+100$$

As described above, by providing the insulating layer and the voltage relaxing layer, in addition to the atmosphere and the first conductive-type SiC, at least a plurality of layers are interposed between the dicing region and the surface electrode. The interposition of these layers effectively prevents discharge between the dicing region and the surface electrode.

On the other hand, between the surface electrode of one device region and the surface electrode of a device region adjacent to the device region mentioned above, pad areas individually exposed are linked to each other via only the atmosphere. Therefore, when measuring the electric characteristics of the semiconductor device structure, if the maximum applied voltage (BV) (≥1000 V) exceeds the discharge starting voltage V in the atmosphere, discharge may occur between the surface electrodes adjacent to each other.

According to the function V=f (P·X1) of Paschen's Law, as X1 decreases, the discharge starting voltage V also lowers. That is, as a result of the present invention, the distance X1 from the end of the pad area to the dicing region (end face of the SiC layer) can be made shorter, however, according to this, the discharge starting voltage V between the surface electrodes linked to each other via only the atmosphere also lowers. Therefore, discharge between the surface electrodes is required to be prevented by preventing the maximum applied voltage (BV) from exceeding the discharge starting voltage V in the atmosphere while the distance X1 is kept as short as possible.

Therefore, in this arrangement, by satisfying the relational expression (1) described above, discharge between surface electrodes adjacent to each other can be reliably prevented while the distance X1 from the end of the pad area to the dicing region (end face of the SiC layer) can be made shorter than conventionally.

In the semiconductor device according to the present invention, it is preferable that the distance X2 from the end of the connected portion connected to the SiC layer of the surface electrode to the end face of the SiC layer is longer than the width of a depletion layer spreading in the horizontal direction along the first surface of the SiC layer from the connected portion when the maximum applied voltage (BV) is applied to the semiconductor device structure (Aspect 3). Regarding the manufacturing method, the step of forming the surface electrode preferably includes a step of setting a relative position of the connected portion to the dicing region so that the distance X2 from the end of the connected portion connected to the SiC wafer of the surface electrode to the dicing region becomes longer than the width of a depletion layer spreading in the horizontal direction along the first surface of the SiC wafer from the connected portion when the maximum applied voltage (BV) is applied to the semiconductor device structure (Aspect 22).

With this arrangement, in each of the semiconductor devices divided into individual pieces, the depletion layer spreading in the horizontal direction from the connected portion connected to the SiC layer of the surface electrode is prevented from reaching the end face of the SiC layer.

The semiconductor device according to the present invention preferably further includes a second conductive-type termination structure formed to be annular along the periphery of the surface electrode in the SiC layer (Aspect 4).

With this arrangement, the degree of extension of the depletion layer from the connected portion connected to the SiC layer of the surface electrode can be adjusted. Furthermore, by adjusting the impurity concentration of the termination structure, the maximum applied voltage (BV) of the semiconductor device structure can also be adjusted. In this case, a plurality of the termination structures may be formed concentrically (Aspect 5).

In the semiconductor device according to the present invention, the insulating layer preferably has a structure consisting of a plurality of layers including a first layer and a second layer laminated in order from the SiC layer (Aspect 6). With this arrangement, according to the magnitude of the maximum applied voltage (BV) required for the semiconductor device structure, the kind of insulating layer can be variously changed.

In the semiconductor device according to the present invention, it is possible that the first layer is formed on the entire first surface of the SiC layer, the second layer has an outer peripheral edge retreated to the inner side of the SiC layer with respect to the end faces of the SiC layer such that the first layer is partially exposed on the end portion of the the first surface of the SiC layer (Aspect 7). In this case, the voltage relaxing layer may be formed to overlap the outer peripheral edge of the second layer in the thickness direction of the SiC layer (Aspect 8), or may be formed so as not to overlap the outer peripheral edge of the second layer (Aspect 9).

In the semiconductor device according to the present invention, the second layer preferably includes a convex portion that selectively penetrates the first layer and reaches the first surface of the SiC layer (Aspect 10). In this case, a plurality of the convex portions of the second layer may be formed (Aspect 11).

With this arrangement, even if the first layer peels from the end face of the SiC layer, this peeling can be stopped by the convex portion of the second layer. Therefore, adhesiveness of the insulating layer to the SiC layer can be improved.

In the semiconductor device according to the present invention, both of the first layer and the second layer may be formed on the entire first surface of the SiC layer (Aspect 12).

In the semiconductor device according to the present invention, the first layer may be composed of any material of silicon oxide ($SiO_2$) with a thickness of 1 μm or more, polyimide with a thickness of 0.2 μm or more, and silicon nitride (SiN) with a thickness of 1 μm or more (Aspects 13 to 15).

In the semiconductor device according to the present invention, the insulating layer may have a structure consisting of a single layer (Aspect 16).

In the semiconductor device according to the present invention, the semiconductor device structure may include a Schottky barrier diode structure formed by composing the surface electrode of a material that forms a Schottky barrier between the surface electrode and the SiC layer (Aspect 17). Furthermore, the semiconductor device structure may include an MIS transistor structure including second conductive-type channel regions selectively formed in the SiC layer, first conductive-type source regions formed in contact with the channel regions, a gate insulating film formed on the channel regions, and a gate electrode opposed to the channel regions via the gate insulating film (Aspect 18).

In the semiconductor device according to the present invention, the SiC layer may include an SiC substrate and an SiC epitaxial layer formed on the SiC substrate, and the SiC epitaxial layer may have an impurity concentration of $1\times10^{16}$ $cm^{-3}$ or less and a thickness of 5 μm or more.

Furthermore, in the method for manufacturing the semiconductor device according to the present invention, in the step of measuring a withstand voltage of the semiconductor device structure, the measurement is preferably performed at a pressure of 720 to 1520 Torr (Aspect 23).

According to the function V=f (P·X1) of Paschen's Law, as the gas pressure P increases, the discharge starting voltage V also becomes higher. Therefore, by setting the gas pressure P for measurement of the electric characteristics in the above-described range, the distance X1 from the end of the pad area to the dicing region (end face of the SiC layer) can be further shortened.

MODES FOR CARRYING OUT THE INVENTION

Hereinafter, preferred embodiments of the present invention are described in detail with reference to the accompanying drawings.

Figure 1:
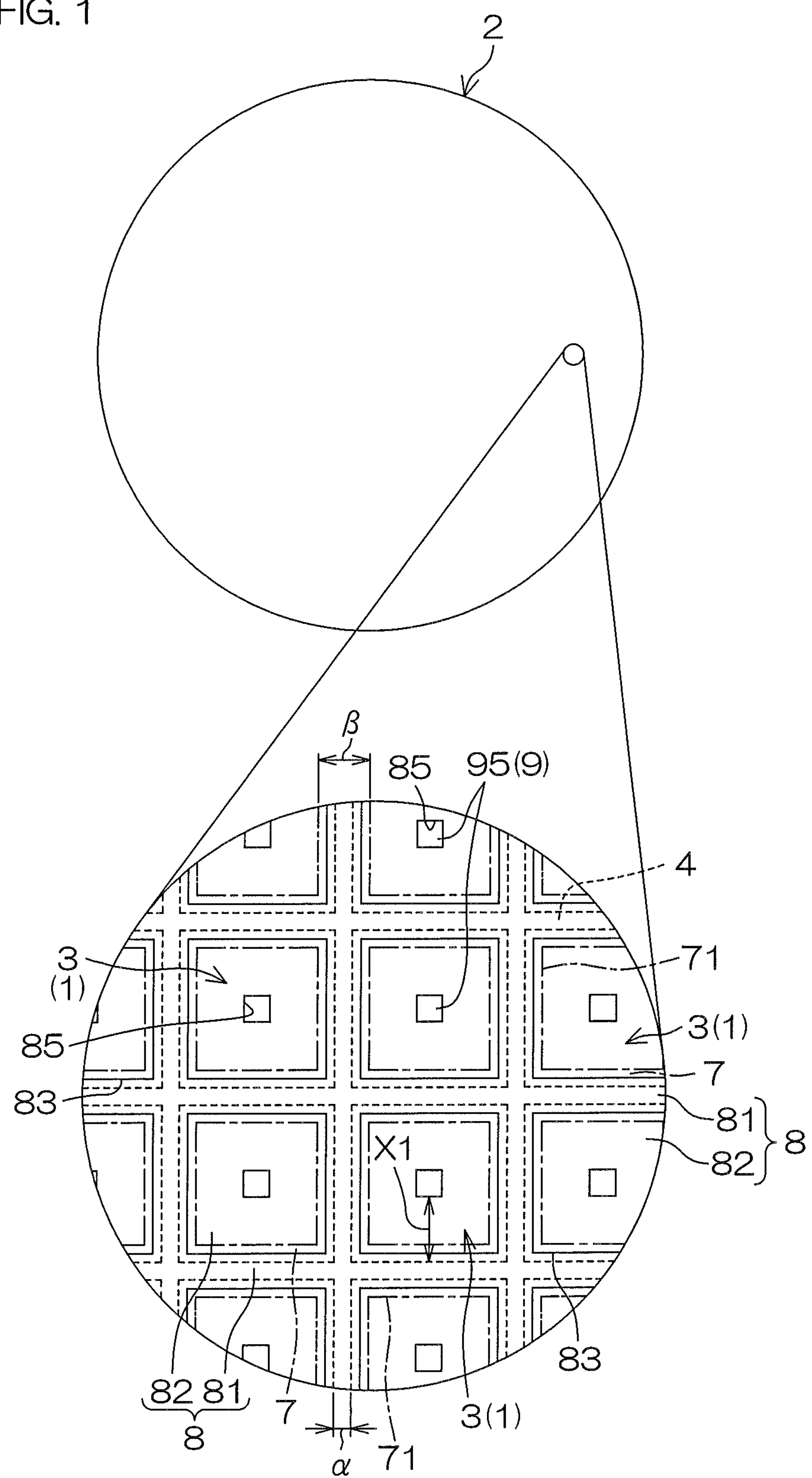
FIG. 1 is a plan view of a semiconductor device according to a first preferred embodiment of the present invention.
Figure 2:
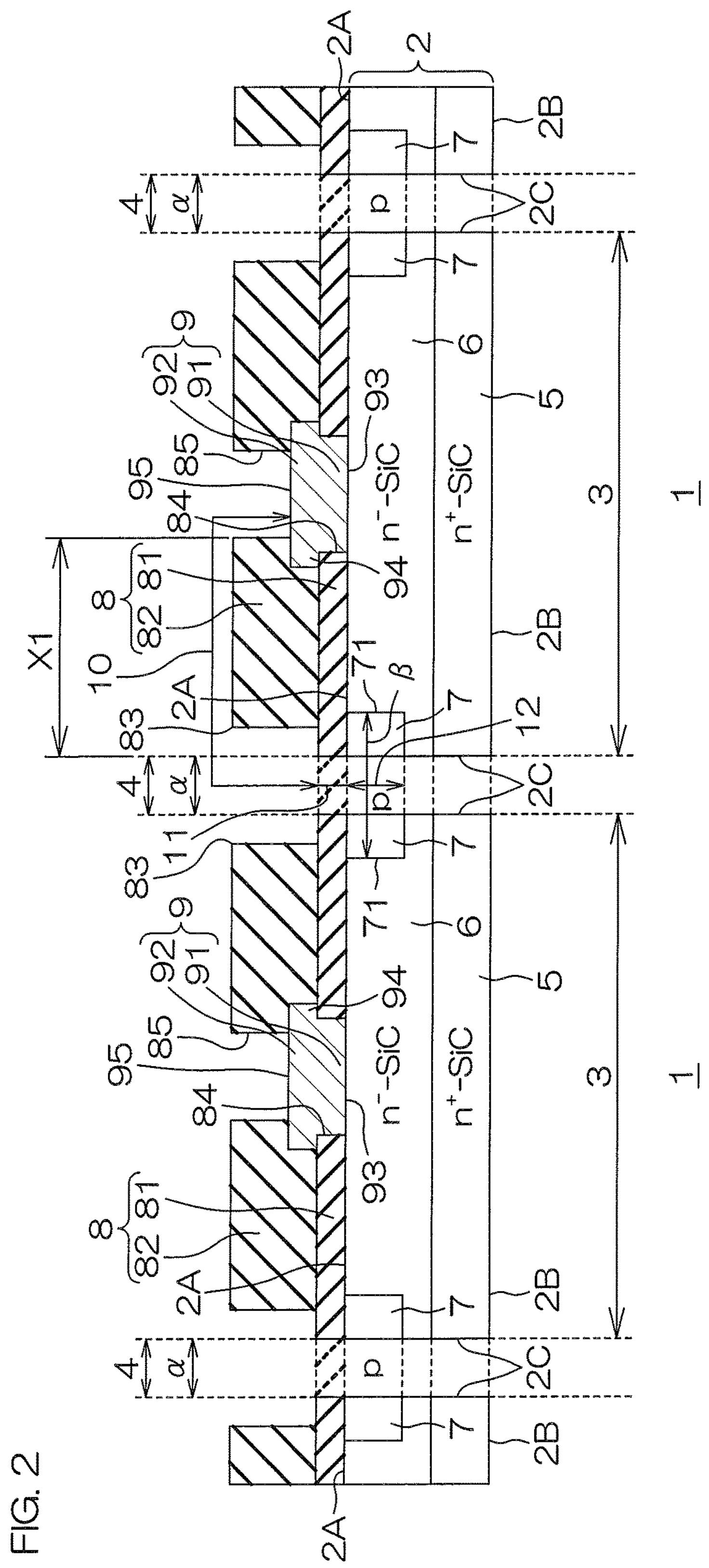
FIG. 2 is a sectional view taken along a cross-sectional line II-II in FIG. 1.

FIG. 1 is a plan view of a semiconductor device according to a first preferred embodiment of the present invention. FIG. 2 is a sectional view taken along a cross-sectional line II-II in FIG. 1. In FIG. 1 and FIG. 2, for easy understanding of the contents of the present invention, semiconductor devices before being divided into individual pieces from a wafer are shown.

The semiconductor device 1 is a device using silicon carbide (SiC). A number of semiconductor devices 1 are regularly aligned and formed on one SiC wafer 2. On the SiC wafer 2 (hereinafter, also referred to as "SiC layer 2"), a dicing region 4 with a predetermined width α (for example, 30 μm to 80 μm) is set to segment a plurality of device regions 3. In the present preferred embodiment, the dicing region 4 is formed in a grid manner, and the plurality of device regions 3 are aligned in a matrix as a whole. The semiconductor device 1 is formed in each device region 3, and the semiconductor devices are divided into individual pieces by cutting the SiC wafer 2 along the dicing region 4. The semiconductor device 1 according to the first preferred embodiment is a Schottky barrier diode.

The SiC layer 2 of each semiconductor device cut out by dividing into individual pieces has a first surface 2A and a second surface 2B, and end faces 2C surrounding the first surface 2A and the second surface 2B. The end faces 2C are SiC layer cutting surfaces (side surfaces) appearing by dividing into individual pieces, and segment the outer peripheries of the first surface 2A and the second surface 2B. In the present preferred embodiment, each semiconductor device 1 has a chip shape square in a plan view. As the size of the chip, the lengths in the up-down direction and the left-right direction of the sheet of FIG. 1 are 0.5 mm to 20 mm. Specifically, the chip size of the semiconductor device 1 is, for example, 0.5 mm square to 20 mm square.

The SiC layer 2 includes a substrate 5 composed of $n^+$-type SiC and an epitaxial layer 6 composed of $n^-$-type SiC formed on the substrate 5. The thickness of the substrate 5 may be 50 μm to 1000 μm, and the thickness of the epitaxial layer 6 may be 5 μm or more (preferably 6 μm to 20 μm). As an n-type dopant contained in the substrate 5 and the epitaxial layer 6, for example, N (nitrogen), P (phosphorus), As (arsenic), etc., can be used (the same applies to the description given below). As a relationship between the dopant concentration of the substrate 5 and the dopant concentration of the epitaxial layer 6, the dopant concentration of the substrate 5 is relatively high, and the dopant concentration of the epitaxial layer 6 is relatively lower than that of the substrate 5. In detail, the dopant concentration of the substrate 5 may be $1\times10^{17}$ to $1\times10^{22}$ $cm^{-3}$, and the dopant concentration of the epitaxial layer 6 may be $1\times10^{16}$ $cm^{-3}$ or less (preferably $1\times10^{15}$ to $9\times10^{15}$ $cm^{-3}$).

In the surficial portion of the epitaxial layer 6, a p-type voltage relaxing layer 7 is formed to be exposed to the end portion of the first surface 2A. In the present preferred embodiment, the voltage relaxing layer 7 is formed to be annular along the outer peripheral edge of the SiC layer 2 so as to be exposed to the corner portions on the first surface 2A side of the SiC layer 2 defined by the first surface 2A and the end faces 2C of the SiC layer 2. Accordingly, the voltage relaxing layer 7 is exposed to both of the first surface 2A and the end faces 2C, and the regions exposed to the faces 2A and 2C are integrated at the corner portion of the SiC layer 2. As a p-type dopant contained in the voltage relaxing layer 7, for example, B (boron), Al (aluminum), etc., can be used. The voltage relaxing layer 7 is formed so that the bottom portion thereof is positioned on the first surface 2A side with respect to the boundary between the substrate 5 and the epitaxial layer 6. In detail, the depth of the voltage relaxing layer 7 may be, for example, 1000 to 10000 angstroms.

On the SiC layer 2, an insulating layer 8 and an anode electrode 9 as a surface electrode are formed. The insulating layer 8 is formed to cover the voltage relaxing layer 7, and has a structure consisting of a plurality of layers including a first layer 81 and a second layer 82 laminated in order from the SiC layer 2. When the insulating layer 8 has a structure consisting of a plurality of layers, according to the magnitude of the maximum applied voltage (BV) required for the Schottky barrier diode, the kind of insulating layer 8 can be variously changed.

In the present preferred embodiment, the first layer 81 is formed on the entire first surface 2A of the SiC layer 2. On the other hand, the second layer 82 is formed so as to expose the portions on the corners of the first surface 2A of the SiC layer 2 in the first layer 81, and has an outer peripheral edge 83 retreated to the inner side of the SiC layer 2 with respect to the end faces 2C. In detail, the voltage relaxing layer 7 covered by the insulating layer 8 is formed to overlap the outer peripheral edge 83 of the second layer 82 in the thickness direction of the SiC layer 2. Specifically, the inner peripheral edge 71 of the voltage relaxing layer 7 is positioned on the inner side of the SiC layer 2 as compared with the outer peripheral edge 83 of the second layer 82. In the first layer 81, a contact hole 84 that selectively exposes the first surface 2A of the SiC layer 2 is formed.

The anode electrode 9 includes a lower end portion 91 embedded in the contact hole 84 and an upper end portion 92 protruding upward from the first layer 81, and the bottom surface of the lower end portion 91 is connected as a connected portion 93 to the first surface 2A of the SiC layer 2 inside the contact hole 84. The upper end portion 92 of the anode electrode 9 further includes a drawn-out portion 94 as a peripheral edge portion uniformly drawn-out in the horizontal direction (direction along the first surface 2A of the SiC layer 2) from the outer peripheral edge of the contact hole 84. Accordingly, the anode electrode 9 is formed to have a size larger than the opening diameter of the contact hole 84 in a plan view.

The peripheral edge portion of the upper end portion 92 of the anode electrode 9 is covered by the second layer 82 higher than the anode electrode. That is, in the second layer 82, a contact hole 85 that selectively exposes the central portion of the anode electrode 9 as a pad area 95 is formed. The contact hole 85 is formed so that the relative position of the outer peripheral edge to the end faces 2C of the SiC layer 2 is further inside than the outer peripheral edge of the contact hole 84. The detailed size of the contact hole 85 is, for example, 500 μm×300 μm when a bonding wire with a 125 μm diameter is connected to the pad area 95.

In the insulating layer 8, in the present preferred embodiment, the first layer 81 is composed of silicon oxide ($SiO_2$) with a thickness of 1 μm or more, and the second layer 82 is composed of polyimide with a thickness of 0.2 μm or more. However, the materials of the insulating layer 8 are not limited to these. For example, the first layer 81 may be composed of polyimide with a thickness of 0.2 μm or more or silicon nitride (SiN) with a thickness of 1 μm or more. Among these materials, in terms of adhesiveness to the SiC layer 2, $SiO_2$ is most preferable.

The anode electrode 9 can be composed of a material that forms a Schottky barrier or hetero junction with respect to the n-type SiC layer 2, specifically, Mo (molybdenum), Ti (titanium), Ni (nickel), or Al (aluminum) as an example of the former material, or polysilicon as an example of the latter material, or the like. That is, the anode electrode 9 forming a Schottky barrier in this semiconductor device 1 may be either of a metal electrode that forms a Schottky barrier between the electrode and the SiC layer 2, and a semiconductor electrode that is composed of a semiconductor having a band gap different from that of the SiC layer 2, and makes a hetero junction to the SiC layer 2 (junction forming a potential barrier between the electrode and the SiC layer 2 by utilizing a band gap difference).

In this semiconductor device 1, when it turns into a forward bias state where a positive voltage is applied to the anode electrode 9 and a negative voltage is applied to the cathode electrode (not illustrated), electrons (carriers) move from the cathode electrode to the anode electrode 9 through the SiC layer 9 and an electric current flows. Accordingly, the semiconductor device 1 (Schottky barrier diode) operates.

Figure 3:
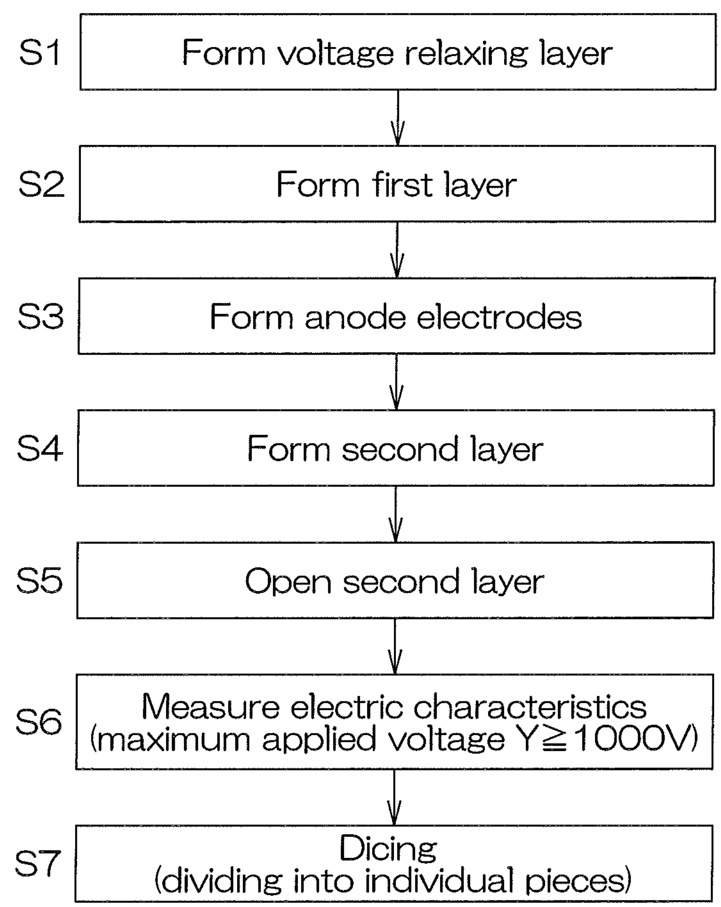
FIG. 3 is a flowchart for describing an example of a manufacturing process for manufacturing the semiconductor device.

Next, a method for manufacturing the semiconductor device 1 is described with reference to FIG. 1 to FIG. 3. FIG. 3 is a flowchart for describing an example of a manufacturing process for manufacturing the semiconductor device.

First, an SiC wafer 2 formed of the substrate 5 and the epitaxial layer 6 is prepared. In this SiC wafer 2, as described above, device regions 3 in which a plurality of semiconductor devices 1 are formed, and a dicing region 4 that segments the device regions 3 and defines the end faces 2C of the plurality of semiconductor devices 1 to be finally divided into individual pieces and separated from each other, are set in a grid manner.

Next, for example, by selectively applying ion implantation and annealing to the first surface 2A of the SiC layer 2, the voltage relaxing layer 7 is formed (Step S1). The voltage relaxing layer 7 is formed along the dicing region 4 so as to have a width β that is wider than the width α of the dicing region 4 and across the device regions 3 adjacent to each other in the middle of manufacturing. That is, in the present preferred embodiment, the voltage relaxing layer 7 is formed in a grid manner with a width β wider than the width α of the dicing region 4 (refer to the alternate long and short dash line in FIG. 1).

Next, according to a known film formation method such as CVD, the first layer 81 is formed on the entire first surface 2A of the SiC layer 2 (Step S2).

Next, the contact holes 84 that selectively expose the first surface 2A of the SiC layer 2 are formed in the first layer 81, and then, for example, by sputtering, the material of the anode electrodes 9 is deposited and patterned to define the anode electrodes 9 (Step S3). The anode electrodes 9 are connected to the SiC layer 2 (epitaxial layer 6) through the contact holes 84 of the first layer 81.

Next, by a known film formation method such as CVD, the second layer 82 is formed on the first layer 81 so as to cover the entire anode electrodes 9 (Step S4). Next, by patterning the second layer 82, the contact holes 85 that selectively expose the central portions of the anode electrodes 9 as pad areas 95 are formed (Step S5). Simultaneously, the grid-shaped portion along the dicing region 4 of the second layer 82 is selectively removed, and the outer peripheral edge 83 of the second layer 82 is retreated to the inner side of each device region 3 with respect to the lines representing the end faces 2C. Through the above-described steps, in each device region 3, a Schottky barrier diode (semiconductor device structure) is defined by junction between the SiC layer 2 and the anode electrode 9.

The next step is measurement of the electric characteristics of each Schottky barrier diode (Step S6). In detail, the anode electrode 9 of one device region 3 is set to 0 V, and the second surface of the SiC wafer 2 is set to 1000 V or more (for example, 1700 V). Accordingly, a maximum applied voltage (BV) that generates a potential difference of 1000 V or more is applied between the anode electrode 9 and the SiC wafer 2, and a withstand voltage of each Schottky barrier diode is measured.

At this time, the n-type portion of the SiC wafer 2 including a part (except for the voltage relaxing layer 7) of the dicing region 4 is fixed to a potential of 1000 V or more, so that between the dicing region 4 and the anode electrode 9, a potential difference of 1000 V or more is generated. Even in this case, according to the present preferred embodiment, the voltage relaxing layer 7 is formed along the dicing region 4, and the voltage relaxing layer 7 is further covered by the insulating layer 8. Therefore, the maximum applied voltage (BV) of 1000 V or more applied between the dicing region 4 and the anode electrode 9 can be relaxed in two stages of the insulating layer 8 and the voltage relaxing layer 7. Accordingly, the burden of the voltage on the atmosphere between the dicing region 4 and the anode electrode 9 can be eased. In other words, as shown in FIG. 2, the voltage applied between the dicing region 4 and the anode electrode 9 can be divided by the atmosphere section 10, the insulating layer section 11, and the voltage relaxing layer section 12. Therefore, even when the discharge starting voltage V in the atmosphere section 10 is made lower than conventionally, the relationship of the discharge starting voltage V>the maximum applied voltage (BV) can be maintained.

Here, based on Paschen's Law, the discharge starting voltage V between two electrodes is expressed by a function of the product of a gas pressure P and the interval between the electrodes (in the present preferred embodiment, the distance X1 from the end of the pad area 95 (outer peripheral edge of the contact hole 85) to the dicing region 4) (V=f (P·X1)). With this semiconductor device 1, the discharge starting voltage V of the atmosphere section 10 can be made lower than conventionally, so that according to Paschen's Law, the distance X1 can be made shorter than conventionally.

Therefore, when the size of the semiconductor device 1 (chip size) is made equal to the conventional one, the outer edge of the pad area 95 can be widened to the end face 2C side of the SiC layer 2, so that the pad area 95 can be made wider than conventionally. On the other hand, when the size of the pad area 95 is made equal to the conventional size, the end faces 2C of the SiC layer 2 can be shortened to the pad area 95 side, so that the number of semiconductor devices 1 (number of chips) to be obtained from one SiC wafer 2 can be increased to be larger than conventionally.

Furthermore, even if a defect (for example, a hole, etc., caused by a process failure) occurs in one of the insulating layer 8 and the voltage relaxing layer 7, the defect can be covered by the other. Therefore, discharge between the dicing region 4 and the anode electrode 9 can be effectively prevented from occurring.

Measurement of the electric characteristics of the Schottky barrier diode can be performed in a gas atmosphere of, for example, the atmosphere, nitrogen ($N_2$), hydrogen ($H_2$), argon (Ar), neon (Ne), helium (He), or the like. The gas pressure P at this time is preferably, for example, 720 Torr to 1520 Torr.

According to the function V=f (P·X1) of Paschen's Law, as the gas pressure P increases, the discharge starting voltage V also becomes higher. Therefore, by setting the gas pressure P for measurement of the electric characteristics in the above-described range, the distance X1 from the end of the pad area 95 to the dicing region 4 (end face 2C of the SiC layer 2) can be further shortened.

Thereafter, the electric characteristics of the Schottky barrier diodes in all device regions 3 are measured according to the same method. After the measurement, the SiC wafer 2 is cut into the individual semiconductor devices 1 by cutting along the dicing region 4. Thus, the semiconductor devices 1 having the structure shown in FIG. 2, etc., are obtained.

Next, effects relating to the distance X1 from the end of the pad area 95 to the end face 2C of the SiC layer 2 are described with reference to FIG. 4.

In the semiconductor device 1, it is preferable that the maximum applied voltage (BV) Y (≥1000 V) to be applied to the Schottky barrier diode and the distance X1 from the end of the pad area 95 to the end face 2C of the SiC layer 2 satisfy the following relational expression (1). In the manufacturing process, it is preferable that the size of the pad area 95 (the size of the contact hole 85) is set so that the maximum applied voltage (BV) Y (≥1000 V) to be applied to the Schottky barrier diode and the distance X1 from the end of the pad area 95 to the dicing region 4 satisfy the following relational expression (1) when exposing the pad area 95 by patterning the second layer 82 (Step S5).

[Numerical expression 2] (1)

$$\left(855\cdot\ln\frac{Y}{1053}\right) \leqq X1 \leqq \left(855\cdot\ln\frac{Y}{1053}\right)+100$$

As described above, by providing the insulating layer 8 and the voltage relaxing layer 7, in addition to the atmosphere section 10, the insulating layer section 11 and the voltage relaxing layer section 12 are interposed between the dicing region 4 and the anode electrode 9. The interposition of the insulating layer 8 and the voltage relaxing layer 7 effectively prevents discharge between the dicing region 4 and the anode electrode 9.

On the other hand, in the section (section 13) between the anode electrode 9 of one device region 3 and the anode electrode 9 of the device region 3 adjacent to the device region 3 mentioned above, pad areas 95 individually exposed are linked to each other via only the atmosphere. Therefore, at the time of measurement of the electric characteristics of the Schottky barrier diode (Step S6), if the maximum applied voltage (BV) (≥1000 V) exceeds the discharge starting voltage V in the atmosphere, discharge may occur between the anode electrodes 9 adjacent to each other.

According to the function V=f (P·X1) of Paschen's Law, as X1 decreases, the discharge starting voltage V also lowers. That is, as a result of the present invention, the distance X1 from the end of the pad area 95 to the dicing region 4 (end face 2C of the SiC layer 2) can be made shorter, however, according to this, the discharge starting voltage V in the section 13 linked via only the atmosphere also lowers. Therefore, discharge in the section 13 must be prevented by preventing the maximum applied voltage (BV) from exceeding the discharge starting voltage V in the atmosphere while the distance X1 is kept as short as possible.

Therefore, in this semiconductor device 1, by satisfying the above-described relational expression (1), discharge between anode electrodes 9 adjacent to each other can be reliably prevented while the distance X1 from the end of the pad area 95 to the dicing region 4 (end face 2C of the SiC layer 2) can be made shorter than conventionally.

Figure 4:
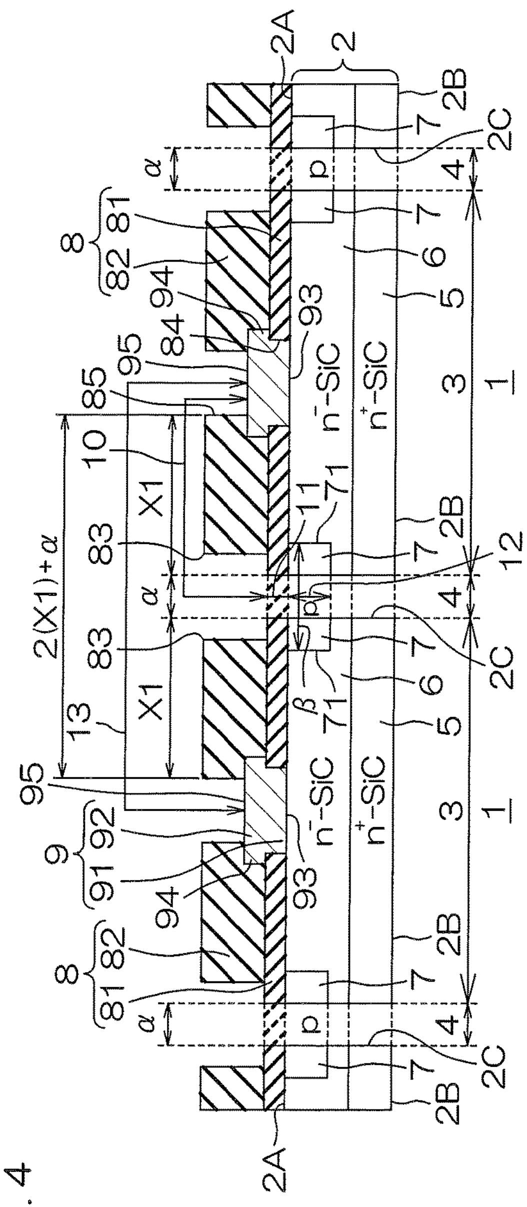
FIG. 4 is a diagram for describing an effect relating to the distance X1 from an end of a pad area to an end face of an SiC layer.
Figure 4:
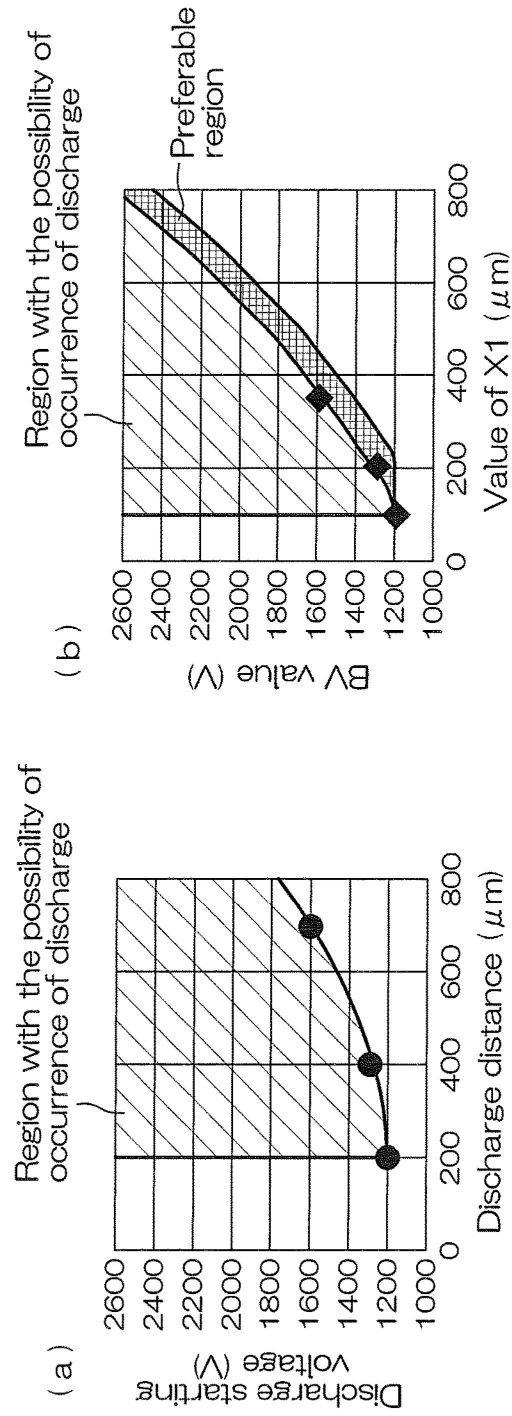

In detail, as a result of investigation performed by the inventor of the present invention, the relationship between the discharge starting voltage V between two electrodes linked to each other via only the atmosphere and the discharge distance can be shown by the graph ($Y=1.053E+03e^{5.846E-04X}$) of FIG. 4(*a*). In this expression, "E" is an exponential expressed in decimal (the same applies to the description hereinafter). For example, 1.053E+03 expresses $1.053\times10^{3}$. $e^{5.846E-04X}$ expresses exp ($5.846\times10^{-04}$–X). Referring to FIG. 4(*a*), in the case where the discharge distance (distance between two electrodes) is 200 μm, 400 μm, or 700 μm, discharge may occur when a potential difference of 1200 V or more, 1300 V or more, or 1600 V or more occurs between the two electrodes. That is, in FIG. 4(*a*), discharge may occur in the case where the coordinates are included in the upper side region (shaded portion) of the graph.

The inventor of the present invention further examined the relationship between the maximum applied voltage (BV) Y and the distance X1 in the semiconductor device 1 based on FIG. 4(*a*). In the semiconductor device 1, the distance corresponding to the discharge distance of FIG. 4(*a*) is the shortest distance between anode electrodes 9 adjacent to each other. This shortest distance corresponds to 2 times (2 (X1)) the distance X1 from the end of each pad area 95 (outer peripheral edge of the contact hole 85) to the dicing region 4 (to be exact, 2 (X1)+α, however, the width α is ignored here). Therefore, in the semiconductor device 1, in the case where the distance X1=100 μm, 200 μm, or 350 μm, when a potential difference of 1200 V or more, 1300 V or more, or 1600 V or more occurs between the anode electrodes 9 adjacent to each other at the time of measurement of the electric characteristics of the Schottky barrier diode, discharge may occur between these. That is, when the maximum applied voltage (BV) that generates this potential difference is applied to the anode electrode 9 of one device region 3, discharge may occur between this anode electrode and the anode electrode 9 of the device region 3 adjacent to the device region 3 mentioned above.

The graph of FIG. 4(*b*) shows graphically the relationship between the maximum applied voltage (BV) Y and the distance X1 in the semiconductor device 1 in consideration of the description given above. The graph of FIG. 4(*b*) shows the function of $Y=1.053E+03^{e1.169E-03X1}$. By converting this function into an expression for X1, X1=855·In (Y/1053) is obtained. In FIG. 4(*b*), discharge may occur when the coordinates are included in the upper region (shaded portion) of the graph, and discharge is unlikely to occur when the coordinates are included in the lower region. Therefore, in order to reliably prevent discharge from occurring between anode electrodes 9 adjacent to each other, the coordinates of the maximum applied voltage (BV) Y and the distance X1 must be included in the lower region of the graph.

However, even when the coordinates are included in the lower region, the distance X1 is preferably as short as possible to obtain the effects of widening the pad area 95 and increasing the number of semiconductor devices 1 to be obtained.

Therefore, in the present preferred embodiment, as described above, setting is made so that the maximum applied voltage (BV) Y and the distance X1 satisfy the following relational expression (1).

[Numerical expression 3]

$$\left(855\cdot\ln\frac{Y}{1053}\right)\leqq X1\leqq\left(855\cdot\ln\frac{Y}{1053}\right)+100 \tag{1}$$

This relational expression (1) shows that the coordinates of the maximum applied voltage (BV) Y and the distance X1 are included in the region (hatched portion) surrounded by X1=855·In (Y/1053) and X1=855·In (Y/1053)+100. Accordingly, while the distance X1 from the end of the pad area 95 to the dicing region 4 (end face 2C of the SiC layer 2) can be made shorter than conventionally, discharge between the anode electrodes 9 adjacent to each other can be reliably prevented.

Next, effects relating to the distance X2 from the end of the connected portion 93 connected to the SiC layer 2 of the anode electrode 9 to the end face 2C are described.

In the semiconductor device 1, the distance X2 from the end of the connected portion 93 (outer peripheral edge of the contact hole 84) connected to the SiC layer 2 of the anode electrode 9 to the end face 2C is preferably longer than the width X3 of the depletion layer 14 spreading in the horizontal direction along the first surface 2A of the SiC layer 2 from the connected portion 93 when the maximum applied voltage (BV) is applied to the Schottky barrier diode. In the manufacturing process, the contact hole 84 is formed in the first layer 81, and when the anode electrode 9 is connected to the SiC layer 2 through the contact hole 84 (Step S3), the relative position of the connected portion 93 to the dicing region 4 is preferably set so that the distance X2 from the end of the connected portion 93 to the dicing region 4 becomes longer than the width X3 of the depletion layer 14.

Generally, it is said that the depletion layer in the semiconductor layer composed of SiC extends to two times in the orthogonal direction (horizontal direction) with respect to the thickness direction (vertical direction) of the semiconductor layer. If the distance X2 is shorter than the width X3 of the depletion layer 14 at the time of application of the maximum applied voltage (BV), when the maximum applied voltage (BV) is applied to each of the semiconductor devices 1 divided into individual pieces, the depletion layer 14 may extend to the end face 2C of the SiC layer 2. Therefore, in this semiconductor device 1, by setting distance X2>width X3, the depletion layer 14 can be prevented from reaching the end face 2C of the SiC layer 2.

In addition, in this semiconductor device 1, the outer peripheral edge of the contact hole 85 which becomes the starting point of the distance X1 is positioned on the inner side of the end faces 2C of the SiC layer 2 as compared with the outer peripheral edge of the contact hole 84 which becomes the starting point of the distance X2. Therefore, the distance X1 and the distance X2 satisfy X1>X2. Accordingly, by making the setting so that the distance X2 satisfies the relational expression (1) described above, the depletion layer 14 can be prevented from being exposed at the end face 2C, and simultaneously, discharge between the anode electrodes 9 adjacent to each other can be reliably prevented.

Here, an example of the distance X2 is described by using detailed numerical values. For example, when the impurity concentration of the epitaxial layer 6 is $7\times10^{15}$ $cm^{-3}$ and the thickness thereof is 7 μm, the maximum applied voltage (BV) becomes 1450 V, theoretically. In this case, theoretically, the depletion layer 14 extends by 15.2 μm in the vertical direction of the epitaxial layer 6. Therefore, theoretically, the width X3 in the horizontal direction of the depletion layer 14 becomes 30.4 μm. The distance X2 is required to be longer than the width X3, so that under this condition, the distance becomes X2>30.4 μm.

On the other hand, when the maximum applied voltage (BV) is 1450 V, the discharge distance in the atmosphere becomes 550 μm with reference to FIG. 4(*a*). To reliably prevent discharge between the adjacent anode electrodes 9, the distance X2 is required to be longer than ½ of this discharge distance, so that the distance becomes X2>275 μm.

That is, to prevent only exposure of the depletion layer 14 at the end face 2C, the distance becomes X2>30.4 μm, and to prevent discharge between the anode electrodes 9 adjacent to each other as well, the distance X2>275 μm.

FIG. 6 to FIG. 14 are drawings for describing constitutions of semiconductor devices according to the second to eighth preferred embodiments of the present invention. In FIG. 6 to FIG. 14, portions corresponding to each portion shown in FIG. 2 described above are designated by the same reference symbols.

Figure 5:
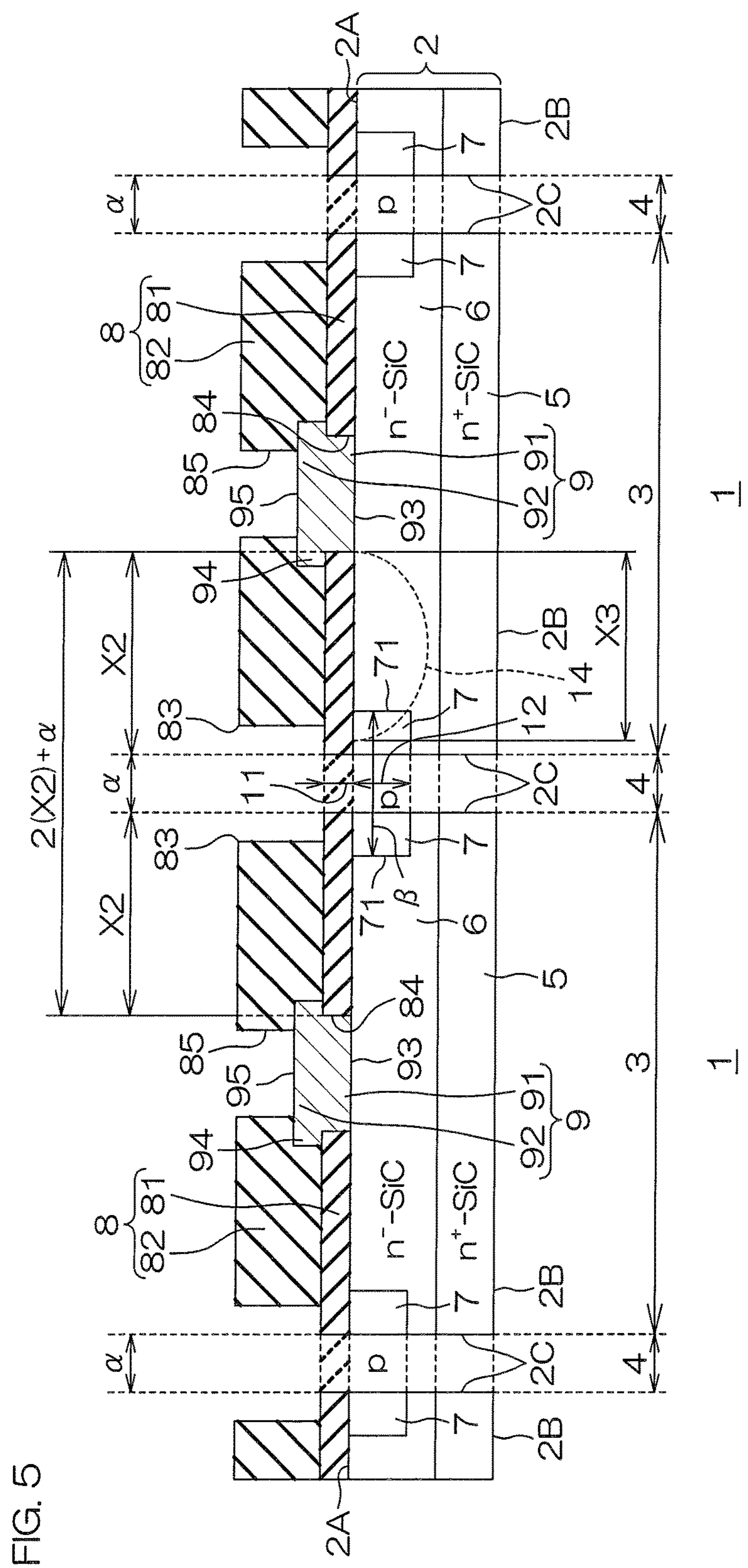
FIG. 5 is a diagram for describing an effect relating to the distance X2 from an end of a connected portion connected to the SiC layer of the anode electrode to an end face.
Figure 6:
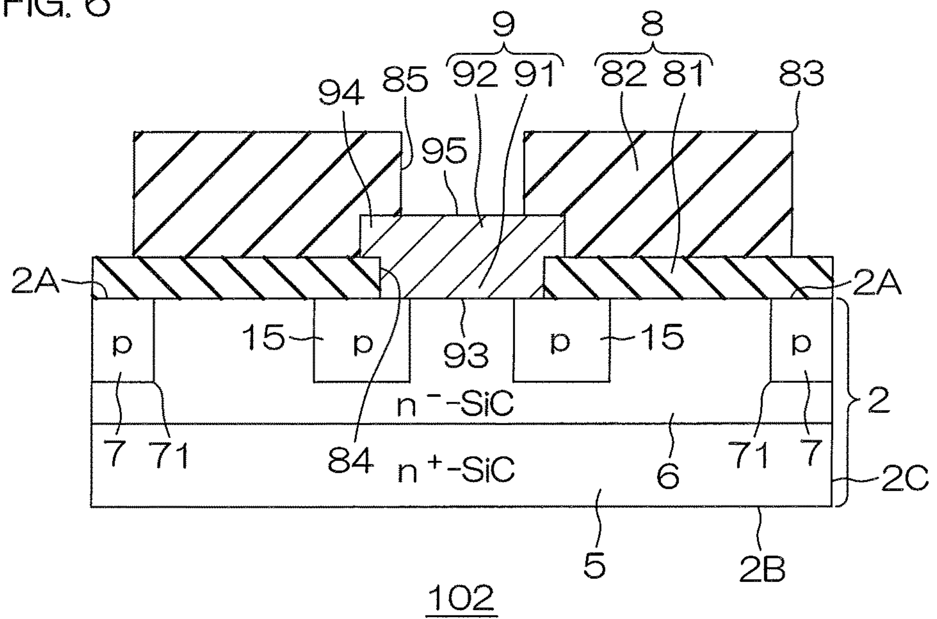
FIG. 6 is a sectional view for describing an arrangement of a semiconductor device according to a second preferred embodiment of the present invention.
Figure 7:
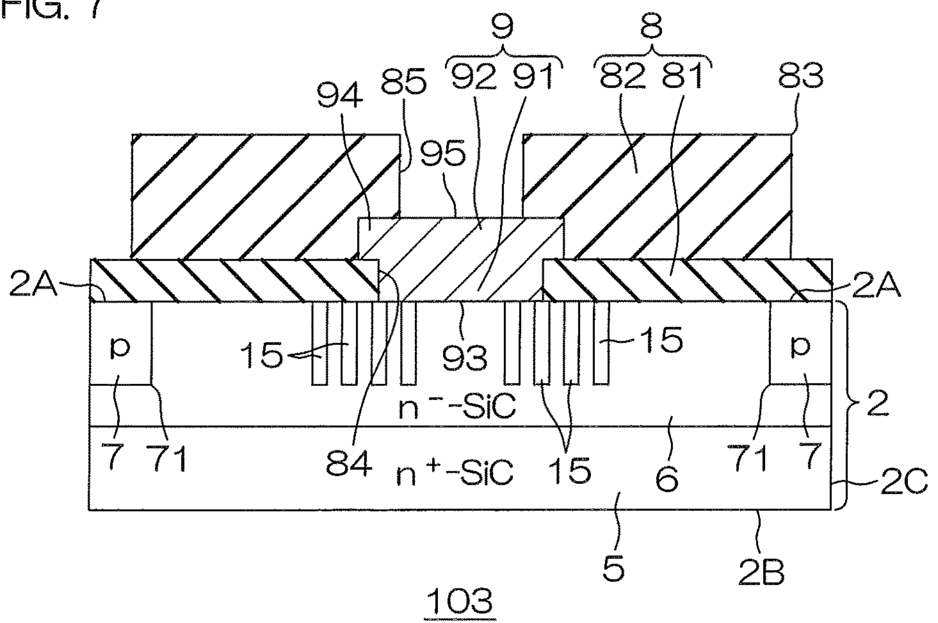
FIG. 7 is a sectional view for describing an arrangement of a semiconductor device according to a third preferred embodiment of the present invention.

In the semiconductor device 102 shown in FIG. 6 according to the second preferred embodiment, a termination structure 15 is further formed in the SiC layer 2. The termination structure 15 is formed to be annular along the periphery of the anode electrode 9, and is across the inside and the outside of the contact hole 84 of the first layer 81. By this termination structure 15, the degree of spreading of the depletion layer 14 (refer to FIG. 5) from the connected portion 93 of the anode electrode 9 can be adjusted. Furthermore, by adjusting the impurity concentration of the termination structure 15, the maximum applied voltage (BV) of the Schottky barrier diode can also be adjusted. Furthermore, a plurality of termination structures may be formed concentrically as in the semiconductor device 103 (third preferred embodiment) shown in FIG. 7.

Figure 8:
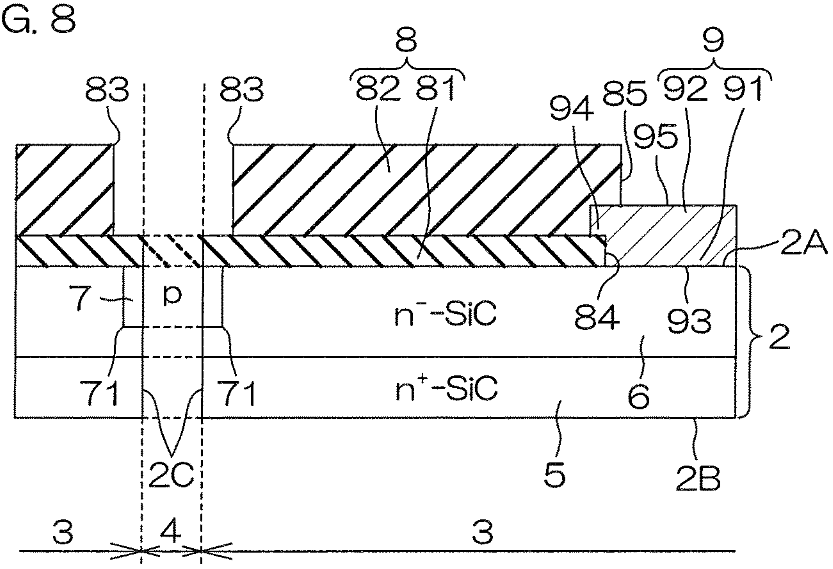
FIG. 8 is a sectional view for describing an arrangement of a semiconductor device according to a fourth preferred embodiment of the present invention.

In the first preferred embodiment, the voltage relaxing layer 7 is formed to overlap the outer peripheral edge 83 of the second layer 82 in the thickness direction of the SiC layer 2, however, the voltage relaxing layer 7 may be formed so as not to overlap the outer peripheral edge 83 of the second layer 82 as in the semiconductor device 104 (fourth preferred embodiment) shown in FIG. 8. Specifically, the inner peripheral edge 71 of the voltage relaxing layer 7 may be positioned on the outer side of the SiC layer 2 as compared with the outer peripheral edge 83 of the second layer 82.

Figure 9:
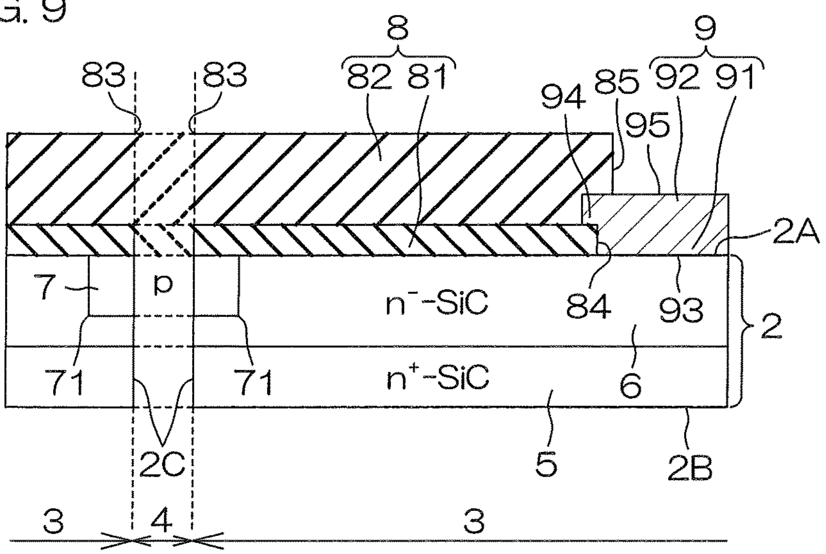
FIG. 9 is a sectional view for describing an arrangement of a semiconductor device according to a fifth preferred embodiment of the present invention.

In the first preferred embodiment, only the first layer 81 is formed on the entire first surface 2A of the SiC layer 2, however, both of the first layer 81 and the second layer 82 may be formed on the entire first surface 2A of the SiC layer 2 as in the semiconductor device 105 (fifth preferred embodiment) shown in FIG. 9.

Figure 10:
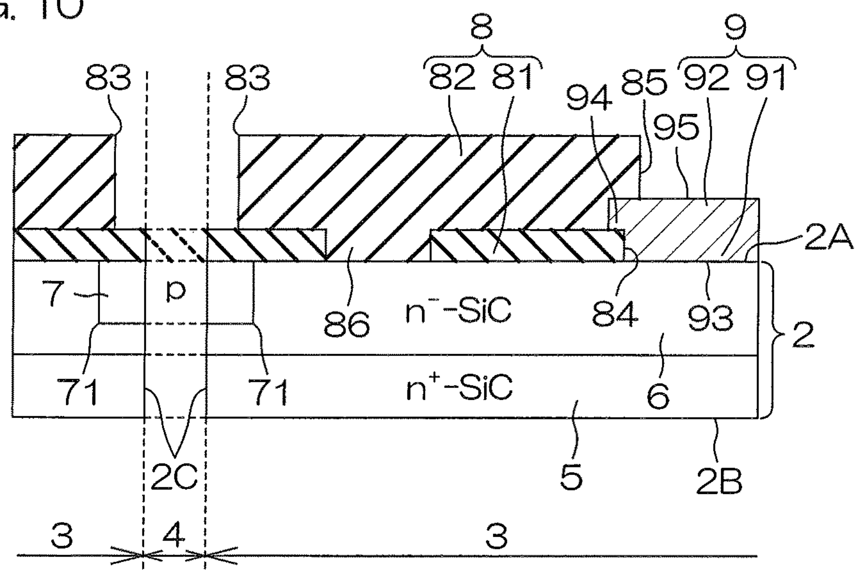
FIG. 10 is a sectional view for describing an arrangement of a semiconductor device according to a sixth preferred embodiment of the present invention.
Figure 11:
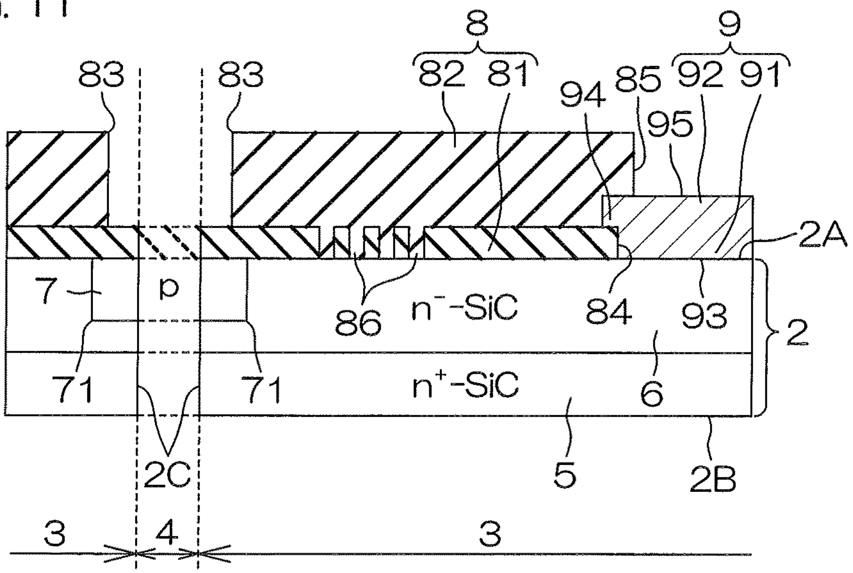
FIG. 11 is a sectional view for describing an arrangement of a semiconductor device according to a seventh preferred embodiment of the present invention.

In the semiconductor devices 106 and 107 shown in FIG. 10 and FIG. 11 according to the sixth and seventh preferred embodiments, the second layer 82 has a convex portion 86 that selectively penetrates the first layer 81 and reaches the first surface 2A of the SiC layer 2. Only one convex portion 86 may be formed as shown in FIG. 10, or a plurality of the convex portions may be formed as shown in FIG. 11. With this arrangement, even if the first layer 81 peels from the end face 2C of the SiC layer 2, this peeling can be stopped by the convex portion 86 of the second layer 82. Therefore, adhesion of the insulating layer 8 to the SiC layer 2 can be improved.

Figure 12:
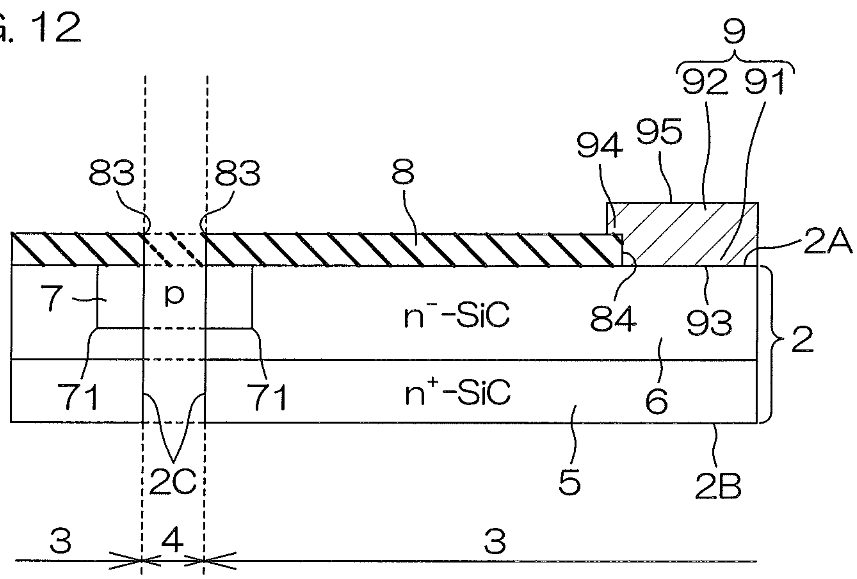
FIG. 12 is a sectional view for describing an arrangement of a semiconductor device according to an eighth preferred embodiment of the present invention.

In the first preferred embodiment, the insulating layer 8 has a structure composed of a plurality of layers including the first layer 81 and the second layer 82, however, the insulating layer 8 may have a structure composed of a single layer as in the semiconductor device 108 (eighth preferred embodiment) shown in FIG. 12.

Figure 13:
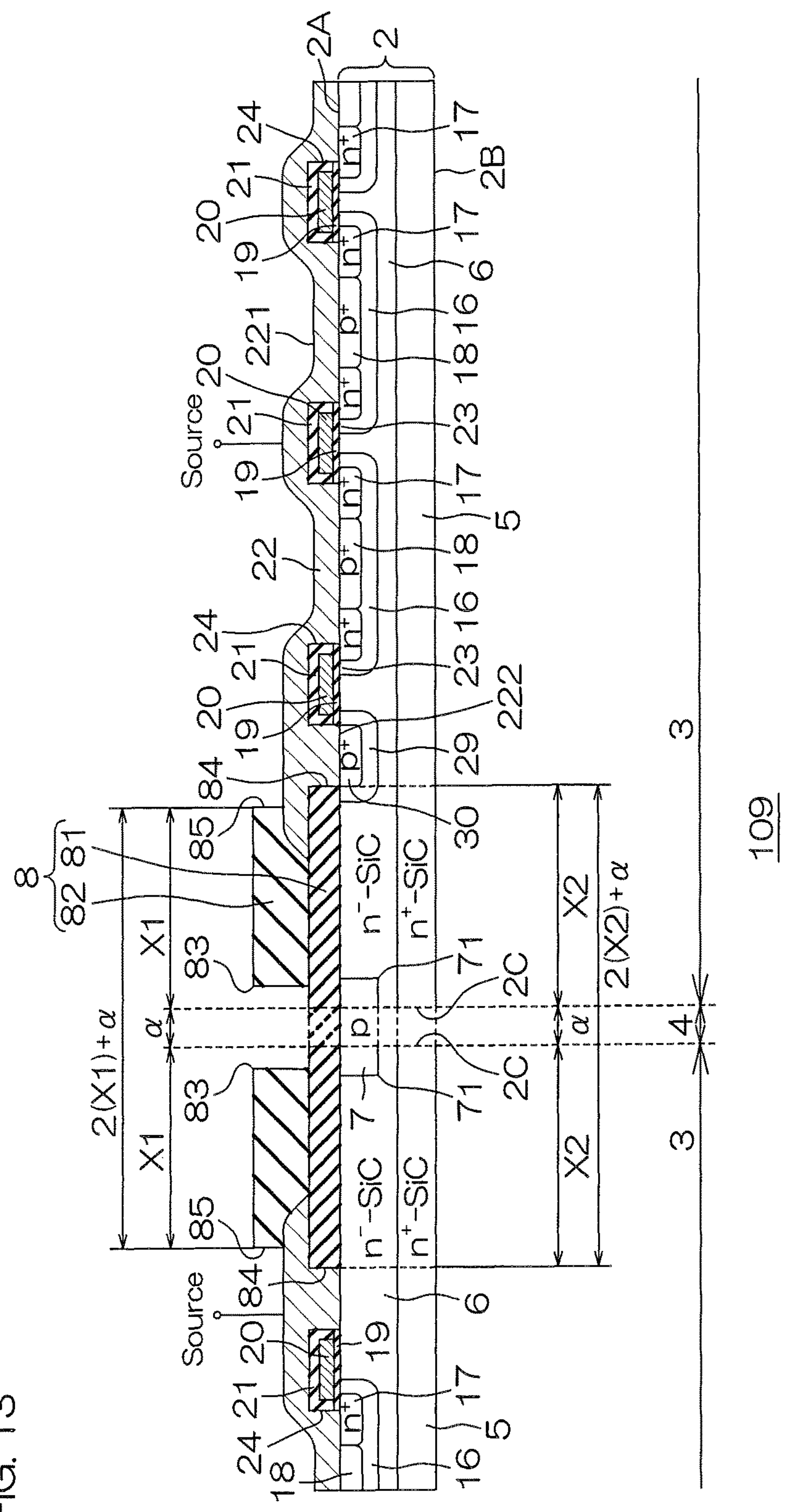
FIG. 13 is a sectional view for describing an arrangement of a semiconductor device according to a ninth preferred embodiment of the present invention.

In the first preferred embodiment described above, the semiconductor device structure formed in the SiC layer 2 is a Schottky barrier diode structure including the SiC layer 2 and the anode electrode 9 that forms a Schottky barrier between the anode electrode and the SiC layer 2, however, in the semiconductor device 109 shown in FIG. 13, an MIS (Metal Insulator Semiconductor) transistor structure is formed as a semiconductor device structure.

The MIS transistor structure includes the SiC layer 2, the p-type channel regions 16, the $n^+$-type source regions 17, the $p^+$-type channel contact regions 18, the gate insulating film 19, and the gate electrode 20. The semiconductor device 109 further includes an interlayer insulating film 21 and a source electrode 22 as a surface electrode as components attached to the MIS transistor structure.

The channel regions 16 are selectively formed in the surficial portion of the epitaxial layer 6, for example, in a plurality of regions discretely disposed periodically on the SiC layer 2. The channel regions 16 may be disposed in, for example, a matrix, zigzag, or striped manner.

The source region 17 is formed in the inside region of the channel region 16. In this region, the source region 17 is selectively formed in the surficial portion of the channel region 16. The source region 17 is formed inside the channel region 16 so as to be positioned at a predetermined distance inward from the interface between the channel region 16 and the epitaxial layer 6. Accordingly, in the surface layer region of the semiconductor layer including the epitaxial layer 6 and the channel region 16, etc., between the source region 17 and the epitaxial layer 6, the surficial portion of the channel region 16 is interposed, and this interposed surficial portion provides the channel portion 23.

The channel contact region 18 penetrates through the source region 17 and is connected to the channel region 18.

The gate insulating film 19 may be composed of, for example, a silicon oxide film, a silicon nitride film, a silicon oxynitride film, a hafnium oxide film, an alumina film, a tantalum oxide film, or the like. The gate insulating film 19 is formed to cover at least the surfaces of the channel regions 16 in the channel portions 23.

The gate electrode 20 is formed such that it is opposed to the channel portions 23 via the gate insulating film 19. The gate electrode 20 may be composed of polysilicon that is reduced in resistance by implanting impurities. In the present preferred embodiment, the gate electrode 20 is formed in almost the same pattern as that of the gate insulating film 19, and covers the surfaces of the gate insulating film 19. Accordingly, a planar gate structure is arranged.

The interlayer insulating film 21 can be formed as, for example, an extended portion obtained by extending the first layer 81 along the first surface 2A of the SiC layer 2. The interlayer insulating film 21 is formed in a pattern that covers the upper surfaces and side surfaces of the gate electrode 20 and has contact holes 24 in the central regions of the channel regions 16 and the inner edge regions of the source regions 17 linked to the central regions.

Figure 14A:
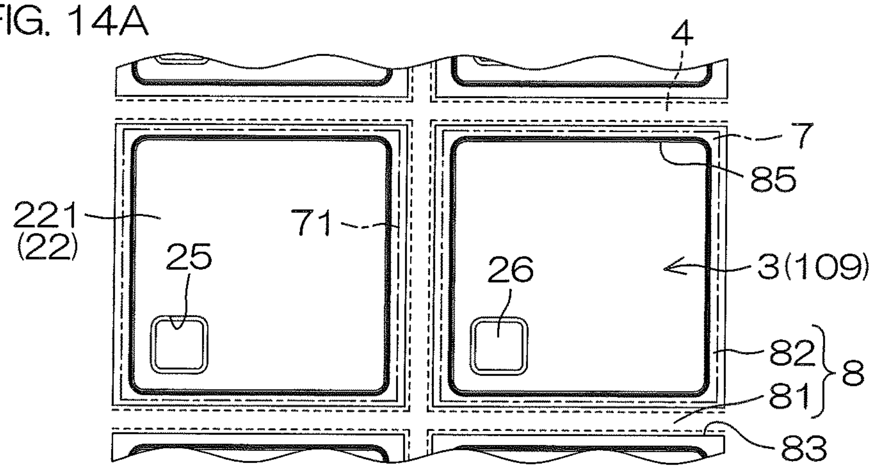
FIG. 14A-C are views for describing an example of a planar structure of the semiconductor device shown in FIG. 13.
Figure 14B:
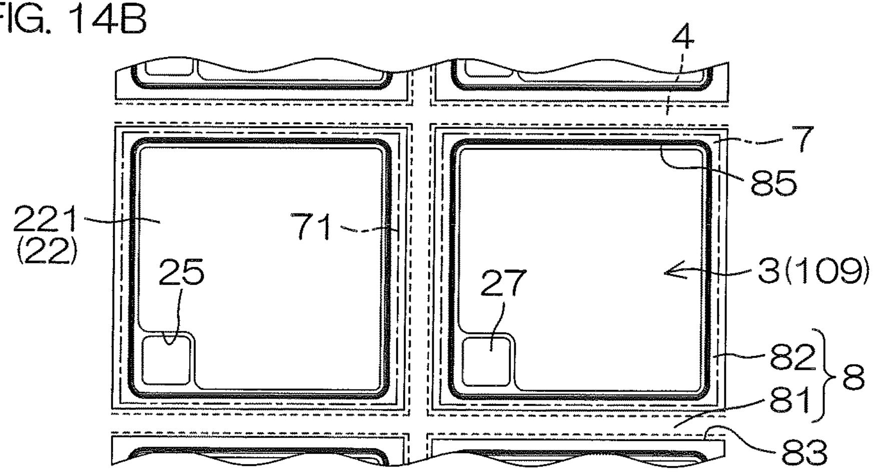
Figure 14C:
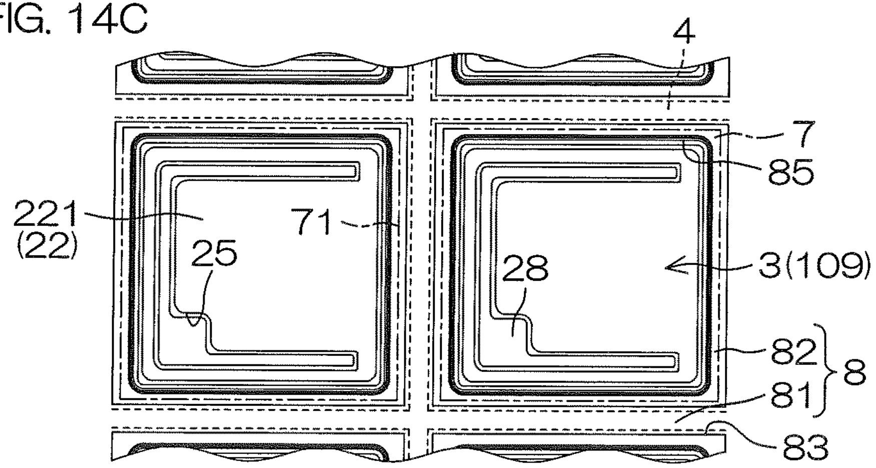

The source electrode 22 is composed of aluminum (Al) and other metals. The source electrode 22 is formed to cover the surfaces of the interlayer insulating film 21 and be embedded in the contact holes 24. Accordingly, the source electrode 22 forms an ohmic contact with the source regions 17. Examples of a planar profile of the source electrode 22 are shown in FIG. 14(*a*) to FIG. 14(*c*). In FIG. 14(*a*) to FIG. 14(*c*), the source electrode 22 is formed to cover almost the entire area of the surface of the semiconductor device 109. In a part of the source electrode 22, a removed region 25 is selectively formed. In the removed region 25, a terminal to be electrically connected to the gate electrode 20 is formed. In detail, in FIG. 14(*a*) and FIG. 14(*b*), gate pads 26 and 27 are respectively formed, and in FIG. 14(*c*), gate fingers 28 are formed. A part of the source electrode 22 is exposed as a pad area 221 from the contact hole 85 of the second layer 82 of the insulating layer 8.

This semiconductor device 109 may include a p-type annular region 29 surrounding the MIS transistor structure in the SiC layer 2, and a contact region 30 formed in the surficial portion of the annular region 29. The annular region 29 and the contact region 30 may be exposed from the contact hole 84 of the first layer 81. That is, when the source electrode 22 as a surface electrode is connected at a plurality of points of the SiC layer 2, the outermost connected portion (in the present preferred embodiment, the connected portion 222 connected to the contact region 30) corresponds to the "connected portion connected to the SiC layer of the surface layer" of the present invention.

In this ninth preferred embodiment, a planar gate structure is described as an example of the MIS transistor structure, however, the MIS transistor structure may be a trench-gate structure.

Preferred embodiments of the present invention are described above, however, the present invention may be carried out in other modes.

For example, an arrangement in which the conductive-types of each semiconductor portion of the semiconductor devices 1, 101 to 109 are inverted may be adopted. For example, in the semiconductor device 1, the p-type portion may be n-type, and the n-type portion may be p-type.

The voltage relaxing layer 7 must be a conductive-type (in the preferred embodiments described above, p-type) different from that of the SiC layer 2. However, a portion of its inside region may have the same conductive-type as that of the SiC layer 2. For example, the voltage relaxing layer 7 may have an n-type region positioned at a predetermined distance inward from the interface between the voltage relaxing layer 7 and the epitaxial layer 6. As the n-type region is formed, for example, in the arrangement shown in FIG. 13, charge-up can be prevented when forming the $n^+$-type source region 17 by ion implantation.

The semiconductor device (semiconductor power device) according to the present invention can be installed in a power module that is used in an inverter circuit constituting a drive circuit for driving an electric motor to be used as a power source of, for example, an electric vehicle (including a hybrid vehicle), train, an industrial robot, or the like. The semiconductor device can also be installed in a power module to be used in an inverter circuit that converts electric power generated by a power generator (in particular, private electric generator) such as a solar cell, a wind power generator, or the like, so as to match electric power of a commercial power source.

The features understood from the disclosure of the above-described preferred embodiments may also be combined between different preferred embodiments. Furthermore, the components presented in the preferred embodiments may be combined within the scope of the present invention.

In addition, various design changes are possible within the scope of the matters described in the claims.

DESCRIPTION OF REFERENCE SIGNS

1: semiconductor device
2: SiC wafer (SiC layer)
2A: first surface
2B: second surface
2C: end face
3: device region
4: dicing region
5: substrate
6: epitaxial layer
7: voltage relaxing layer
8: insulating layer
81: first layer
82: second layer
83: outer peripheral edge
86: convex portion
9: anode electrode
93: connected portion
95: pad area
14: depletion layer
15: termination structure
16: channel region
17: source region
19: gate insulating film
20: gate electrode
22: source electrode
221: pad area
222: connected portion
102: semiconductor device
103: semiconductor device
104: semiconductor device
105: semiconductor device
106: semiconductor device
107: semiconductor device
108: semiconductor device
109: semiconductor device

The invention claimed is:

1. A semiconductor device comprising:

a first conductive-type semiconductor layer having a first surface, a second surface and end faces surrounding the first surface and the second surface, the semiconductor layer having a semiconductor device structure;

a second conductive-type voltage relaxing layer formed in the semiconductor layer;

an insulating layer covering the voltage relaxing layer; and a surface electrode connected to the first surface of the semiconductor layer through the insulating layer, the surface electrode having a pad area selectively exposed, wherein a distance X2 from an end of a portion of the surface electrode connected to the semiconductor layer to an end face of the semiconductor layer is longer than a width of a depletion layer spreading in a horizontal direction along the first surface of the semiconductor layer from a portion of the surface electrode connected to the semiconductor layer when a maximum applied voltage (BV) is applied to the semiconductor device structure.

2. The semiconductor device according to claim 1, further comprising a second conductive-type termination structure formed to be annular along a periphery of the surface electrode in the semiconductor layer.

3. The semiconductor device according to claim 2, wherein a plurality of the termination structures are formed concentrically.

4. The semiconductor device according to claim 1, wherein the insulating layer has a structure consisting of a plurality of layers including a first layer and a second layer laminated in order from the semiconductor layer.

5. The semiconductor device according to claim 4, wherein the first layer is formed on an entire first surface of the semiconductor layer, and the second layer has an outer peripheral edge retreated to an inner side of the semiconductor layer with respect to end faces of the semiconductor layer such that the first layer is partially exposed on an end portion of the first surface of the semiconductor layer.

6. The semiconductor device according to claim 5, wherein the voltage relaxing layer is formed to overlap the outer peripheral edge of the second layer in the thickness direction of the semiconductor layer.

7. The semiconductor device according to claim 5, wherein the voltage relaxing layer is formed so as not to overlap an outer peripheral edge of the second layer in a thickness direction of the semiconductor layer.

8. The semiconductor device according to claim 5, wherein the second layer includes a convex portion that selectively penetrates the first layer and reaches the first surface of the semiconductor layer.

9. The semiconductor device according to claim 8, wherein a plurality of a convex portions of the second layer are formed.

10. The semiconductor device according to claim 4, wherein both of the first layer and the second layer are formed on an entire first surface of the semiconductor layer.

11. The semiconductor device according to claim 4, wherein the first layer is composed of silicon oxide ($SiO_2$) with a thickness of 1 μm or more.

12. The semiconductor device according to claim 4, wherein the first layer is composed of polyimide with a thickness of 0.2 μm or more.

13. The semiconductor device according to claim 4, wherein the first layer is composed of silicon nitride (SiN) with a thickness of 1 μm or more.

14. The semiconductor device according to claim 1, wherein the insulating layer has a structure consisting of a single layer.

15. The semiconductor device according to claim 1, wherein the semiconductor device structure includes a Schottky barrier diode structure formed by composing the surface electrode of a material that forms a Schottky barrier between the surface electrode and the semiconductor layer.

16. The semiconductor device according to claim 1, comprising an MIS transistor structure that includes second conductive-type channel regions selectively formed in the semiconductor layer, first conductive-type source regions formed in contact with the channel regions, a gate insulating film formed on the channel regions, and a gate electrode opposed to the channel regions via the gate insulating film.

17. The semiconductor device according to claim 1, wherein the semiconductor layer includes an semiconductor substrate and an epitaxial layer formed on the semiconductor substrate, and the epitaxial layer has an impurity concentration of $1\times10^{16}$ $cm^{-3}$ or less and a thickness of 5 μm or more.

18. A semiconductor device comprising:

a first conductive-type semiconductor layer having a first surface, a second surface and end faces surrounding the first surface and the second surface, the semiconductor layer having a semiconductor device structure;

a second conductive-type voltage relaxing layer formed in the semiconductor layer such that the voltage relaxing layer is exposed to an end portion of the first surface of the semiconductor layer;

an insulating layer covering the voltage relaxing layer; and a surface electrode connected to the first surface of the semiconductor layer through the insulating layer, the surface electrode having a pad area selectively exposed, wherein a maximum applied voltage (BV) Y (≥1000 V) of the semiconductor device structure and a distance X1 from an end of the pad area to an end face of the semiconductor layer satisfy the following relational expression (1):

[Numerical expression 1] (1)

$$\left(855\cdot\ln\frac{Y}{1053}\right)\leq X1\leq\left(855\cdot\ln\frac{Y}{1053}\right)+100.$$

19. A method for manufacturing a semiconductor device, comprising the steps of: in a first conductive-type semiconductor wafer which has a first surface and a second surface and a dicing region with a predetermined width set to segment a plurality of device regions, forming a semiconductor device structure in each of the device regions, forming a second conductive-type voltage relaxing layer with a width wider than that of the dicing region along the dicing region so as to be across the device regions adjacent to each other, forming an insulating layer on the semiconductor wafer so as to cover the voltage relaxing layer, forming a surface electrode in each of the device regions so that the surface electrode is connected to the first surface of the semiconductor wafer through the insulating layer and partially selectively exposed as a pad area, measuring electric characteristics of the semiconductor device structure of one of the device regions by applying a maximum applied voltage (BV) that generates a potential difference of 1000 V or more between the surface electrode and the semiconductor wafer in the device region, and dividing the semiconductor wafer into individual pieces of a plurality of semiconductor devices by cutting the semiconductor wafer along the dicing region, wherein the step of forming the surface electrode includes a step of setting a relative position of a portion of the surface electrode connected to the semiconductor layer to the dicing region so that a distance X2 from an end of the portion of the surface electrode connected to the semiconductor wafer to the dicing region becomes longer than a width of a depletion layer spreading in the horizontal direction along the first surface of the semiconductor wafer from the portion of the surface electrode connected to the semiconductor wafer when a maximum applied voltage (BV) is applied to the semiconductor device structure.

20. The method for manufacturing a semiconductor device according to claim 19, wherein in the step of measuring a withstand voltage of the semiconductor device structure, the measurement is performed at a pressure of 720 to 1520 Torr.

21. A method for manufacturing a semiconductor device, comprising the steps of: in a first conductive-type semiconductor wafer which has a first surface and a second surface and a dicing region with a predetermined width set to segment a plurality of device regions, forming a semiconductor device structure in each of the device regions, forming a second conductive-type voltage relaxing layer with a width wider than that of the dicing region along the dicing region so as to be across the device regions adjacent to each other, forming an insulating layer on the semiconductor wafer so as to cover the voltage relaxing layer, forming a surface electrode in each of the device regions so that the surface electrode is connected to the first surface of the semiconductor wafer through the insulating layer and partially selectively exposed as a pad area, measuring electric characteristics of the semiconductor device structure of one of the device regions by applying a maximum applied voltage (BV) that generates a potential difference of 1000 V or more between the surface electrode and the semiconductor wafer in the device region, and dividing the semiconductor wafer into individual pieces of a plurality of semiconductor devices by cutting the semiconductor wafer along the dicing region, wherein the step of forming the surface electrode includes a step of setting a size of the pad area so that the maximum applied voltage (BV) Y (≥1000 V) of the semiconductor device structure and a distance X1 from the end of the pad area to the dicing region satisfy the following relational expression (1):

[Numerical expression 2]

$$\left(855\cdot\ln\frac{Y}{1053}\right)\leq X1\leq\left(855\cdot\ln\frac{Y}{1053}\right)+100. \quad (1)$$

* * * * *